(12) United States Patent
Zhu et al.

(10) Patent No.: US 9,806,169 B2
(45) Date of Patent: Oct. 31, 2017

(54) SEMICONDUCTOR DEVICES HAVING A GATE STACK

(71) Applicant: INSTITUTE OF MICROELECTRONICS, CHINESE ACADEMY OF SCIENCES, Beijing (CN)

(72) Inventors: Huilong Zhu, Poughkeepsie, NY (US); Qingqing Liang, Lagrangeville, NY (US); Huicai Zhong, San Jose, CA (US)

(73) Assignee: INSTITUTE OF MICROELECTRONICS, CHINESE ACADAMY OF SCIENCES, Beijing (CN)

( * ) Notice: Subject to any disclaimer, the term of this patent is extended or adjusted under 35 U.S.C. 154(b) by 53 days.

(21) Appl. No.: 14/389,055

(22) PCT Filed: Nov. 26, 2012

(86) PCT No.: PCT/CN2012/085256
§ 371 (c)(1),
(2) Date: Sep. 29, 2014

(87) PCT Pub. No.: WO2014/059728
PCT Pub. Date: Apr. 24, 2014

(65) Prior Publication Data
US 2015/0054073 A1 Feb. 26, 2015

(30) Foreign Application Priority Data

Oct. 19, 2012 (CN) .......................... 2012 1 0399154

(51) Int. Cl.
*H01L 29/66* (2006.01)
*H01L 29/78* (2006.01)
(Continued)

(52) U.S. Cl.
CPC ........ *H01L 29/6656* (2013.01); *H01L 29/105* (2013.01); *H01L 29/1083* (2013.01);
(Continued)

(58) Field of Classification Search
CPC ......... H01L 21/28282; H01L 27/11529; H01L 29/6656; H01L 29/105; H01L 29/1083;
(Continued)

(56) References Cited

U.S. PATENT DOCUMENTS

| 5,187,112 A | 2/1993 | Kohno et al. |
| 6,515,319 B2 | 2/2003 | Widmann et al. |

(Continued)

FOREIGN PATENT DOCUMENTS

| CN | 101154594 A | 4/2008 |
| CN | 101840862 A | 9/2010 |

OTHER PUBLICATIONS

First Office Action dated Dec. 16, 2015 in corresponding Chinese Application No. 201210399154.3 with English language translation.

*Primary Examiner* — Trung Q Dang
*Assistant Examiner* — Patricia Reddington
(74) *Attorney, Agent, or Firm* — Drinker Biddle & Reath LLP

(57) ABSTRACT

Semiconductor devices and methods for manufacturing the same are provided. In one embodiment, the method may include: forming a first shielding layer on a substrate, and forming one of source and drain regions with the first shielding layer as a mask; forming a second shielding layer on the substrate, and forming the other of the source and drain regions with the second shielding layer as a mask; removing a portion of the second shielding layer which is next to the other of the source and drain regions; forming a gate dielectric layer, and forming a gate conductor as a (Continued)

spacer on a sidewall of a remaining portion of the second shielding layer; and forming a stressed interlayer dielectric layer on the substrate.

6 Claims, 13 Drawing Sheets

(51) Int. Cl.
  *H01L 29/10* (2006.01)
  *H01L 29/49* (2006.01)
  *H01L 21/265* (2006.01)

(52) U.S. Cl.
  CPC ...... *H01L 29/4983* (2013.01); *H01L 29/6653* (2013.01); *H01L 29/66659* (2013.01); *H01L 29/66689* (2013.01); *H01L 29/7816* (2013.01); *H01L 29/7833* (2013.01); *H01L 29/7835* (2013.01); *H01L 29/7843* (2013.01); *H01L 21/2658* (2013.01); *H01L 21/26586* (2013.01)

(58) Field of Classification Search
  CPC ............ H01L 29/4983; H01L 29/6653; H01L 29/66659; H01L 29/7816; H01L 29/7833; H01L 29/7835; H01L 29/7843; H01L 21/2658; H01L 21/26586; H01L 29/66689
  USPC ....................................................... 257/343
  See application file for complete search history.

(56) References Cited

U.S. PATENT DOCUMENTS

| | | | |
|---|---|---|---|
| 7,488,656 B2 * | 2/2009 | Cartier | H01L 21/28079 438/142 |
| 2008/0020533 A1 * | 1/2008 | Thei | H01L 21/26506 438/286 |
| 2009/0294873 A1 | 12/2009 | Zhu et al. | |
| 2010/0193856 A1 * | 8/2010 | Okuyama | H01L 21/28282 257/324 |
| 2010/0193963 A1 * | 8/2010 | Richter | H01L 21/7682 257/774 |
| 2012/0299084 A1 * | 11/2012 | Saito | H01L 21/28282 257/324 |

* cited by examiner

SEMICONDUCTOR DEVICES HAVING A GATE STACK

CROSS-REFERENCE TO RELATED APPLICATION(S)

This application is a national phase application of PCT Application No. PCT/CN2012/085256, filed on Nov. 26, 2012, entitled "SEMICONDUCTOR DEVICES AND METHODS FOR MANUFACTURING THE SAME," which claims priority to Chinese Application No. 201210399154.3, filed on Oct. 19, 2012. Both the PCT application and the Chinese application are incorporated herein by reference in their entirety.

TECHNICAL FIELD

The present disclosure relates to the semiconductor field, and particularly, to semiconductor devices and methods for manufacturing the same.

BACKGROUND

With continuous scaling down of semiconductor devices, short channel effects are becoming more significant. Thus, a gate stack configuration comprising a high-K gate dielectric and a metal gate conductor is proposed. To avoid degradation of the gate stack, semiconductor devices with such a gate stack configuration are manufactured generally by means of the replacement gate process. The replacement gate process involves filling the high-K dielectric and the metal gate conductor in a gap defined between gate spacers. However, it is becoming more and more difficult to fill the high-K dielectric and the metal gate conductor in the small gap due to the scaling down of the semiconductor devices.

SUMMARY

The present disclosure provides, among others, semiconductor devices and methods for manufacturing the same.

According to an aspect of the present disclosure, there is provided a method for manufacturing a semiconductor device. The method may comprise: forming a first shielding layer on a substrate, and forming one of source and drain regions with the first shielding layer as a mask; forming a second shielding layer on the substrate, and forming the other of the source and drain regions with the second shielding layer as a mask; removing a portion of the second shielding layer which is next to the other of the source and drain regions; forming a gate dielectric layer, and forming a gate conductor as a spacer on a sidewall of a remaining portion of the second shielding layer; and forming a stressed interlayer dielectric layer on the substrate.

According to a further aspect of the present disclosure, there is provided a semiconductor device, The device may comprise a substrate; and source and drain regions and a gate stack formed on the substrate. The gate stack may comprise a gate dielectric layer; and a gate conductor, which is formed as a spacer on a sidewall of a dielectric layer or a gate spacer on one side of the gate stack. The device may further comprise a stressed interlayer dielectric layer formed on the substrate.

BRIEF DESCRIPTION OF THE DRAWINGS

The above and other objects, features, and advantages of the present disclosure will become more apparent from following descriptions of embodiments with reference to the attached drawings, in which.

DETAILED DESCRIPTION

Figure 1:
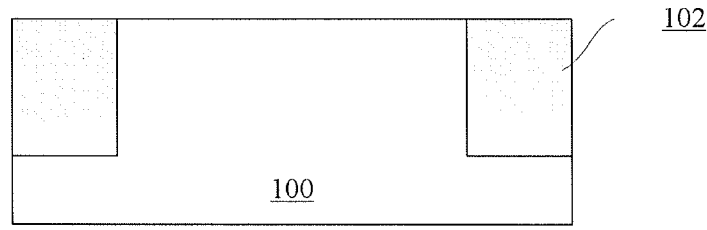
FIGS. 1-9 are schematic views showing a flow of manufacturing a semiconductor device according to an embodiment of the present disclosure.

Hereinafter, descriptions are given with reference to embodiments shown in the attached drawings. However, it is to be understood that these descriptions are illustrative and not intended to limit the present disclosure. Further, in the following, known structures and technologies are not described to avoid obscuring the present disclosure unnecessarily.

In the drawings, various structures according to the embodiments are schematically shown. However, they are not drawn to scale, and some features may be enlarged while some features may be omitted for sake of clarity. Moreover, shapes and relative sizes and positions of regions and layers shown in the drawings are also illustrative, and deviations may occur due to manufacture tolerances and technique limitations in practice. Those skilled in the art can also devise regions/layers of other different shapes, sizes, and relative positions as desired.

In the context of the present disclosure, when a layer/element is recited as being "on" a further layer/element, the layer/element can be disposed directly on the further layer/element, or otherwise there may be an intervening layer/element interposed therebetween. Further, if a layer/element is "on" a further layer/element in an orientation, then the layer/element can be "under" the further layer/element when the orientation is turned.

In the conventional process, after source and drain regions are formed in a substrate with the aid of a "dummy" gate stack and spacers on opposite sides of the dummy gate stack, the spacers are reserved to define a gap therebetween, and a true gate stack can be formed by filling the gap. In contrast, the present disclosure proposes a "replacement spacer" process. Specifically, after source and drain regions are formed, material layer(s) present on the side of either one of the source and drain regions is (are) reserved, and a gate stack (particularly, a gate conductor) is formed as a spacer on a sidewall of the reserved material layer(s). In this way, formation of the gate stack is done in a relatively large space (substantially corresponding to a gate region+the other of the source and drain regions). This process is easier to perform as compared with the conventional process where formation of the gate stack is done in the small gap between the spacers.

According to embodiments of the present disclosure, the source and drain regions can be formed in an active region of the substrate by means of shielding layer(s). For example, a first shielding layer may be adopted to mask the active region to expose a portion of the active region, which can be processed to form one of the source and drain regions. Further, a second shielding layer may be adopted to mask the active region to expose another portion of the active region, which can be processed to form the other of the source and drain regions.

The first and second shielding layers can be formed in various ways, provided that they can shield the active region to expose the respective portions of the active region. In this way, the first and second shielding layers serve as masks in the source/drain formation process. Further, the second shielding layer may comprise some portion(s) from the first shielding layer.

When the source and drain regions are formed as described above, the second shielding layer can be patterned so that a portion thereof is removed, to further expose a further portion of the active region. On the exposed further portion, a gate stack can be formed. For example, the gate stack may be formed by a spacer formation process. For convenience of patterning the second shielding layer, the second shielding layer may preferably comprise several portions of different materials, at least some of which have etching selectivity with respect to each other so that some of them can be removed selectively.

The technology of the present disclosure can be implemented in various ways, some of which will be described in the following by way of example.

Firstly, a flow of manufacturing a semiconductor device according to an embodiment of the present disclosure is described with reference to FIGS. 1-9.

As shown in FIG. 1, a substrate 100 is provided. The substrate 100 may comprise any suitable substrate, including, but not limited to, a bulk semiconductor substrate such as a bulk Si substrate, a Semiconductor On Insulator (SOI) substrate, a SiGe substrate, or the like. In the following, the substrate is described as a bulk Si substrate for convenience. On the substrate 100, Shallow Trench Isolations (STIs) 102 can be formed to isolate active regions of individual devices. For example, the STIs 102 may comprise oxide (e.g., silicon oxide). In the following, formation of a single one device is described for convenience. However, it is to be noted that the present disclosure is not limited thereto, and is also applicable to formation of two or more devices.

Figure 2:
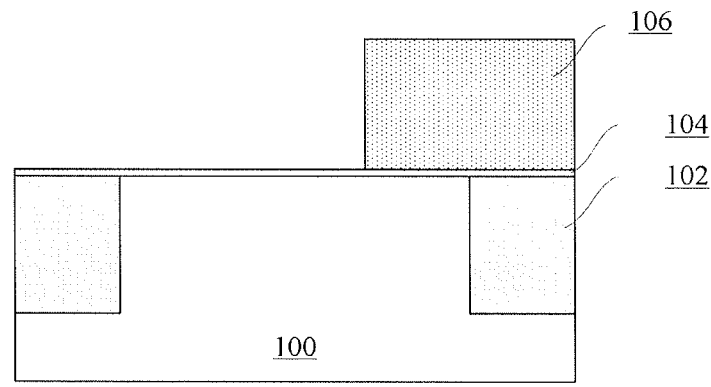

Next, as shown in FIG. 2, a thin oxide layer (e.g., silicon oxide) 104 is optionally formed on a surface of the substrate 100 by means of e.g. deposition. For example, the oxide layer 104 may have a thickness of about 5-10 nm, and can be used to form an Interfacial Layer (IL) subsequently. On the substrate 100 (or on the oxide layer 104 in the case where the oxide layer 104 is formed), a first shielding sub-layer 106 with a thickness of e.g. about 100-200 nm can be formed by means of e.g. deposition. For example, the first shielding sub-layer 106 may comprise nitride (e.g. silicon nitride). The first shielding sub-layer 106 can be patterned by means of e.g. Reactive Ion Etching (RIE) to cover a portion of the active region (which portion substantially corresponds to a later formed source or drain region).

Figure 3:
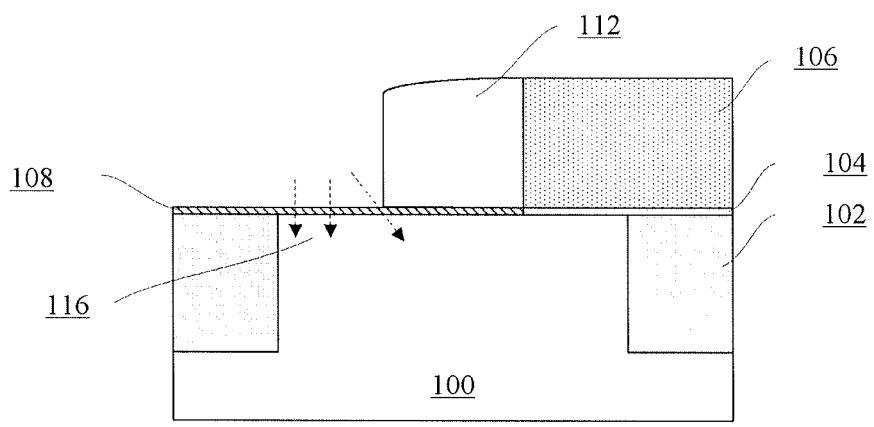

In the case where the oxide layer 104 is formed, the oxide layer 104 can be selectively etched with respect to the first shielding sub-layer 106 (e.g., nitride) and the substrate 100 (e.g., bulk Si), to form an IL 108 with a thickness of e.g. about 0.5-1 nm, as shown in FIG. 3. Here, the difference in thickness between the IL 108 and the oxide layer 104 is not shown for convenience of illustration.

Further, as shown in FIG. 3, a first spacer 112 may be formed on a sidewall of the first shielding sub-layer 106. For example, the first spacer 112 is formed to have a width of about 15-60 nm to cover a portion of the active region (which portion substantially corresponds to a later formed gate region). The first spacer 112 may comprise polysilicon or amorphous silicon, for example. There are various ways to form the spacer, and detailed descriptions on formation of the spacer are omitted here.

Thus, the first shielding sub-layer 106 and the first spacer 112 (which together constitute a "first shielding layer") expose a portion of the active region. Then, one of the source and drain regions can be formed in the exposed portion of the active region by means of a source/drain formation process. For example, this can be done as follows.

Specifically, as shown in FIG. 3 (especially, indicated by vertical arrows shown therein), extension implantation can be carried out to form an extension region 116. For example, for a p-type device, the implantation can be done by implanting p-type impurities such as In, $BF_2$ or B; for an n-type device, the implantation can be done by implanting n-type impurities such as As or P, to form the extension region. It is to be noted that the dashed line block 116 in FIG. 3 is shown as a regular rectangular shape for convenience of illustration. In practice, the profile of the extension region 116 depends on the process, and may have no definite boundaries. Further, to improve the performance, halo implantation can be carried out before the extension implantation, as indicated by angled arrows in FIG. 3. For example, for a p-type device, the implantation can be done by implanting n-type impurities such as As or P; for an n-type device, the implantation can be done by implanting p-type impurities such as In, $BF_2$ or B, to form a halo region (not shown).

Figure 4:
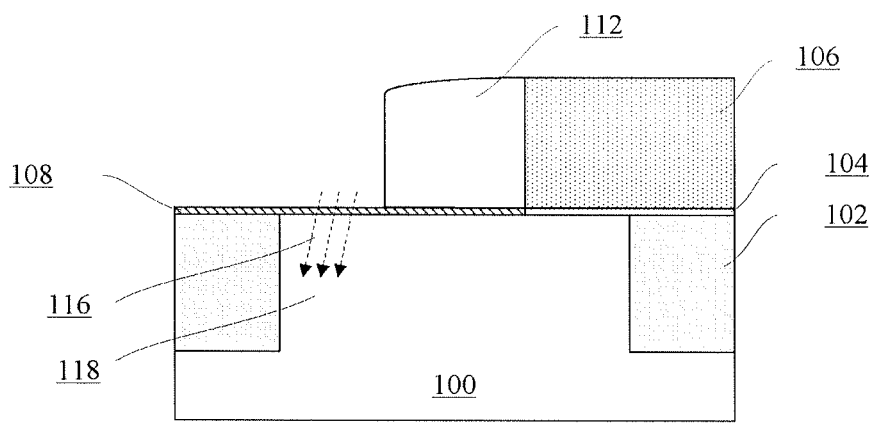

Then, as indicated by arrows in FIG. 4, source/drain implantation can be done to form a source/drain implantation region 118. For example, for a p-type device, the implantation can be done by implanting p-type impurities such as In, $BF_2$ or B; for a n-type device, the implantation can be done by implanting n-type impurities such as As or P, to form the source/drain implantation region. It is to be noted that the dashed line block 118 in FIG. 4 is shown as a regular rectangular shape for convenience of illustration. In practice, the profile of the source/drain implantation region 118 depends on the process, and may have no definite boundaries.

Figure 5:
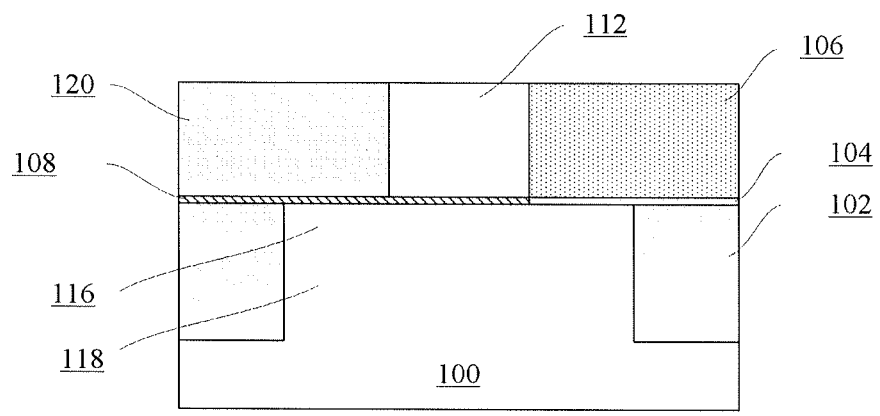

Next, as shown in FIG. 5, a second shielding sub-layer 120 may be formed on the substrate 100, to cover at least the above formed one of the source and drain regions. For example, the second shielding sub-layer 120 may comprise oxide (e.g., silicon oxide). Then, a planarization process such as Chemical Mechanical Polishing (CMP) can be performed to expose the first shielding layer (including the first shielding sub-layer 106 and the first spacer 112) to facilitate following processes.

Figure 6:
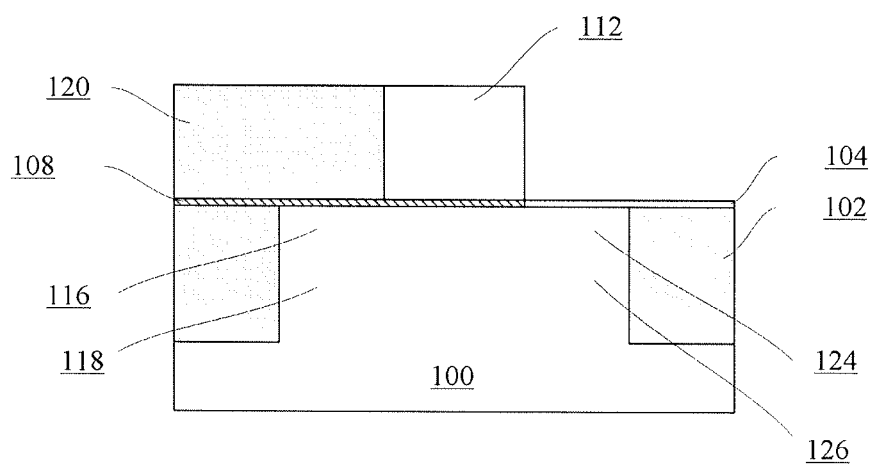

Subsequently, as shown in FIG. 6, the first shielding sub-layer 106 can be removed by selectively etching the first shielding sub-layer 106 (e.g., silicon nitride) with respect to the first spacer 112 (e.g., polysilicon or amorphous silicon), and the second shielding sub-layer 120 and the oxide layer 104 (e.g., silicon oxide). The selective etching can be done by hot phosphoric acid, for example.

Thus, as shown in FIG. 6, the second shielding sub-layer 120 and the first spacer 112 (which together constitute a "second shielding layer" as described above) expose a portion of the active region. Then, the other of the source and drain regions can be formed in the exposed portion of the active region by means of a source/drain formation process. For example, this can be done as follows.

Specifically, as shown in FIG. 6, extension implantation can be carried out to form an extension region 124. For example, for a p-type device, the implantation can be done by implanting p-type impurities such as In, BF$_2$ or B; for an n-type device, the implantation can be done by implanting n-type impurities such as As or P, to form the extension region. It is to be noted that the dashed line block 124 in FIG. 6 is shown as a regular rectangular shape for convenience of illustration. In practice, the profile of the extension region 124 depends on the process, and may have no definite boundaries. Further, to improve the performance, halo implantation can be carried out before the extension implantation. For example, for a p-type device, the implantation can be done by implanting n-type impurities such as As or P; for an n-type device, the implantation can be done by implanting p-type impurities such as In, BF$_2$ or B, to form a halo region (not shown). After that, source/drain implantation can be done to form a source/drain implantation region 126. For example, for a p-type device, the implantation can be done by implanting p-type impurities such as In, BF$_2$ or B; for an n-type device, the implantation can be done by implanting n-type impurities such as As or P, to form the source/drain implantation region. It is to be noted that the dashed line block 126 in FIG. 6 is shown as a regular rectangular shape for convenience of illustration. In practice, the profile of the source/drain implantation region 126 depends on the process, and may have no definite boundaries.

Figure 7:
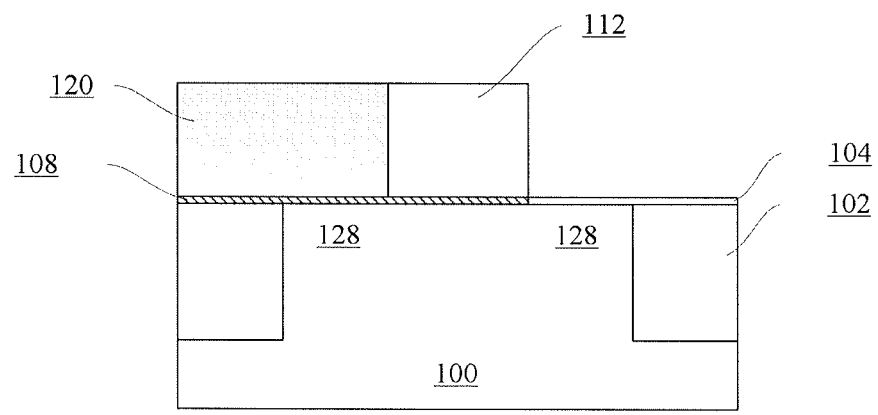

Next, as shown in FIG. 7, annealing, such as spike annealing, laser annealing, and flash annealing, can be performed to activate the implanted impurities, to form final source and drain regions 128. Then, the first spacer 112 can be removed by selective etching. For example, the first spacer 112 (e.g., polysilicon or amorphous silicon) may be selectively removed by means of a TMAH solution. As a result, a relatively large space (substantially corresponding to the gate region+the other of the source and drain regions) is reserved on the side of the second shielding sub-layer 120, so that it is easy to form a gate stack.

Figure 8:
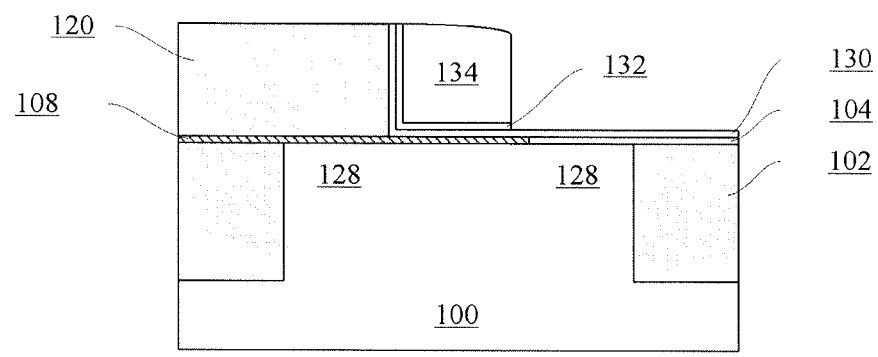

Then, as shown in FIG. 8, the gate stack can be formed. Specifically, a gate dielectric layer 130 can be formed by means of e.g. deposition. For example, the gate dielectric layer 130 may comprise a high-K gate dielectric material such as HfO$_2$, with a thickness of about 2-4 nm. Optionally, an IL can be rebuilt before formation of the gate dielectric layer 130. For example, the IL (not shown) can be formed by selectively etching the oxide layer 104, as described above with reference to FIG. 3. On the gate dielectric layer 130, a gate conductor 134 can be formed as a spacer. In formation of the gate conductor, parameters adopted in the spacer formation process, such as deposition thickness and RIE parameters, can be controlled to locate the gate conductor 134 as a spacer substantially between the underlying source and drain regions formed as described above. For example, the gate conductor 134 may comprise a metal gate conductor material, such as Ti, Co, Ni, Al, W, or any alloy thereof. Further, there may be a work function adjustment layer 132 sandwiched between the gate dielectric layer 130 and the gate conductor 134. For example, the work function adjustment layer 132 may comprise any one of TaC, TiN, TaTbN, TaErN, TaYbN, TaSiN, HfSiN, MoSiN, RuTa, NiTa, MoN, TiSiN, TiCN, TaAlC, TiAlN, TaN, PtSi, Ni$_3$Si, Pt, Ru, Ir, Mo, HfRu, RuO$_x$, or any combination thereof, with a thickness of about 2-10 nm.

Figure 9:
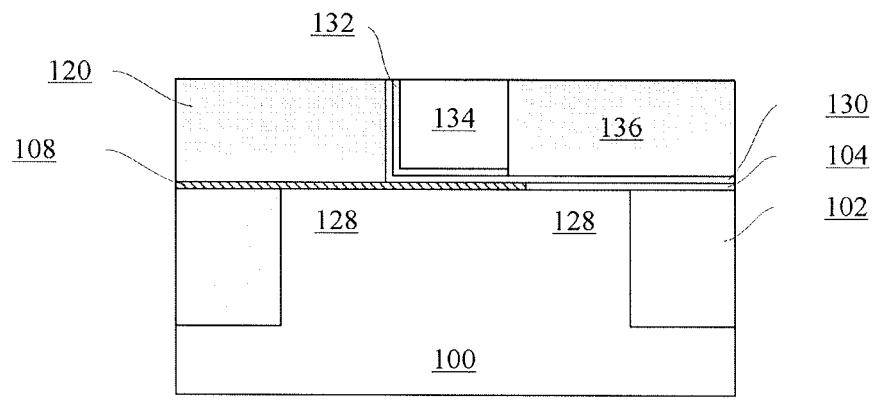

After that, as shown in FIG. 9, an interlayer dielectric layer 136 can be formed by means of e.g. deposition, and planarized by means of e.g., CMP. The dielectric layer 136 may comprise oxide (e.g., silicon oxide), nitride or any combination thereof. Then, peripheral components such as contacts can be formed, and detailed descriptions thereof are omitted here.

According to an embodiment, the interlayer dielectric layer 136 may be stressed. For example, for a p-type device, the interlayer dielectric layer 136 may be compressive-stressed; for an n-type device, the interlayer dielectric layer 136 may be tensile-stressed. Due to the stressed interlayer dielectric layer 136, the performance of the device can be further improved. For example, the stressed interlayer dielectric layer 136 may comprise stressed nitride.

Thus, an illustrative semiconductor device according to the present disclosure is achieved. As shown in FIG. 9, the semiconductor device may comprise the source and drain regions (128) and the gate stack (130, 132, 134) formed on the substrate. The gate stack, especially, the gate conductor 134, is formed as a spacer on the sidewall of the shielding layer (or a dielectric layer) 120 on one side (the left side in the example shown in FIG. 9) of the gate stack.

Figure 10:
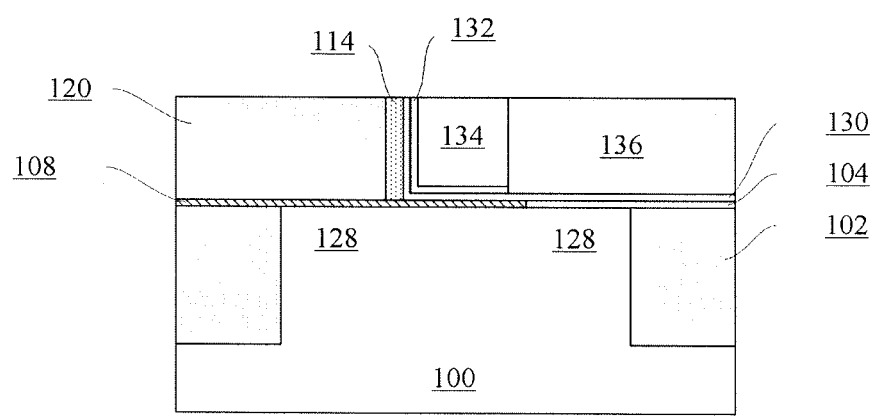
FIG. 10 is a schematic view showing a semiconductor device according to a further embodiment of the present disclosure.

FIG. 10 is a schematic view showing a semiconductor device according to a further embodiment of the present disclosure. The semiconductor device shown in FIG. 10 differs from that shown in FIG. 9 in that: the gate stack, especially, the gate conductor 134, is formed as a spacer on a sidewall of a second spacer 114 on one side (the left side in the example shown in FIG. 10) of the gate stack.

The device shown in FIG. 10 can be manufactured according to the process described above with reference to FIGS. 1-9. For example, the second spacer 114 can be additionally formed on the sidewall of the second shielding sub-layer 120 after the first spacer 112 is removed (referring to the above descriptions in conjunction with FIG. 7). The second spacer 114 may comprise nitride (e.g., silicon nitride), with a thickness of about 5-20 nm. Alternatively, the second spacer 114 may be formed by the first spacer 112 which is partially removed in the process of removing the first spacer 112 (referring to the above descriptions in conjunction with FIG. 7), or may be formed on a sidewall of the first spacer 112 (referring to FIG. 4) in which case the second shielding sub-layer 120 is formed on a sidewall of the second spacer 114 (referring to FIG. 5).

Next, a flow of manufacturing a semiconductor device according to a further embodiment of the present disclosure is described with reference to FIGS. 11-17. Similar or like reference symbols in FIGS. 11-17 denote similar or like components as those shown in FIGS. 1-9. In the following, descriptions are mainly directed to differences between this embodiment and the above described embodiments.

Figure 11:
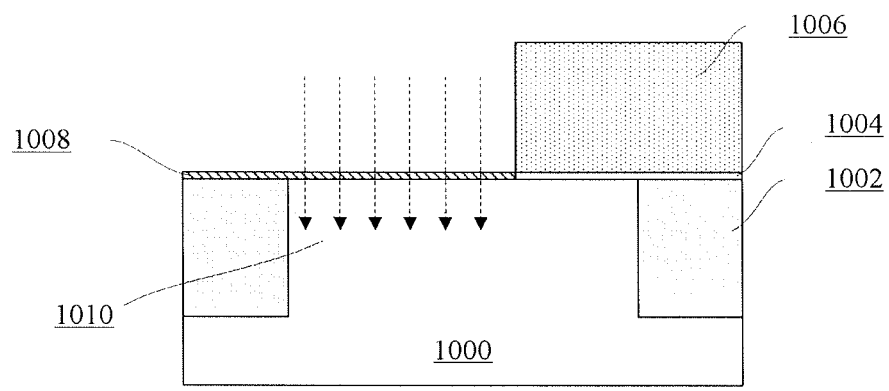
FIGS. 11-17 are schematic views showing a flow of manufacturing a semiconductor device according to a further embodiment of the present disclosure.

As shown in FIG. 11, a substrate 1000 is provided. On the substrate 1000, STIs 1002 can be formed. Optionally, a thin oxide layer 1004 is formed on a surface of the substrate 1000. For details of the substrate 1000 and the oxide layer 1004, reference may be made to the above descriptions on the substrate 100 and the oxide layer 104 in conjunction with FIGS. 1-2.

On the substrate 1000 (or on the oxide layer 1004 in the case where the oxide layer 1004 is formed), a first shielding sub-layer 1006 with a thickness of e.g. about 100-200 nm can be formed by means of e.g. deposition. For example, the first shielding sub-layer 1006 may comprise nitride (e.g. silicon nitride). The first shielding sub-layer 1006 can be patterned by means of e.g. RIE to cover a portion of the active region (which portion substantially corresponds to a later formed source or drain region).

According to an embodiment, for better control of short channel effects and suppression of band-to-band leakage, a Super-Steep-Retrograded Well (SSRW) 1010 can be formed by ion implantation (indicated by arrows) with the first shielding sub-layer 1006 as a mask, as shown in FIG. 11. For example, for a p-type device, the implantation can be done by implanting n-type impurities such as As, P, or Sb, for an n-type device, the implantation can be done by implanting p-type impurities such as In, $BF_2$ or B, to form the SSRW. It is to be noted that the dashed line block 1010 in FIG. 11 is shown as a regular rectangular shape for convenience of illustration. In practice, the profile of the SSRW 1010 depends on the process, and may have no definite boundaries.

Figure 12:
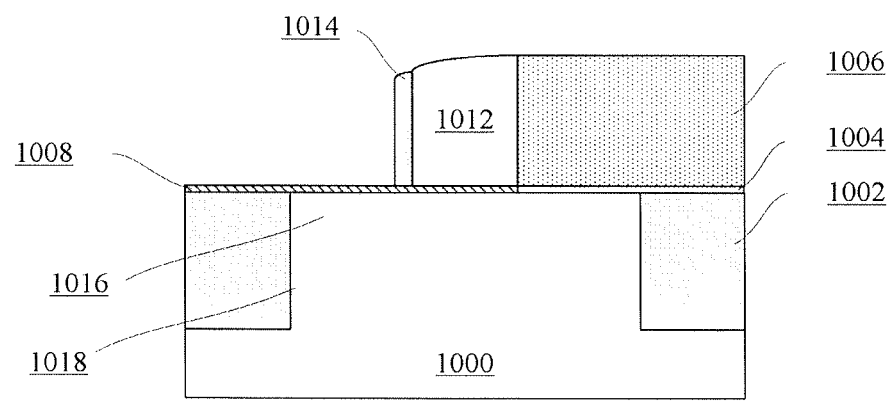

Subsequently, as shown in FIG. 12, a first sub-spacer 1012 may be formed on a sidewall of the first shielding sub-layer 1006. For example, the first sub-spacer 1012 is formed to have a width of about 5-50 nm to cover a portion of the active region (which portion substantially corresponds to a later formed gate region). The first sub-spacer 1012 may comprise polysilicon or amorphous silicon, for example. On a sidewall of the first sub-spacer 1012, a second sub-spacer 1014 may be formed. For example, the second sub-spacer 1014 may comprise oxide (e.g., silicon oxide), with a dimension substantially corresponding to a gate spacer (e.g., with a width of about 5-20 nm). There are various ways to form the spacers, and detailed descriptions on formation of the spacers are omitted here.

Thus, the first sub-spacer 1012 and the second sub-spacer 1014 (which together constitute "a first spacer") and the first shielding sub-layer 1006 (which together constitute "a first shielding layer") expose a portion of the active region. Then, one of the source and drain regions can be formed in the exposed portion of the active region by means of a source/drain formation process. For example, a halo region (not shown), an extension region 1016 and a source/drain implantation region 1018 can be formed according to the process described above in conjunction with FIGS. 3 and 4. For details of the halo region, the extension region 1016 and the source/drain implantation region 1018, reference may be made to the above descriptions in conjunction with FIGS. 3 and 4.

Figure 13:
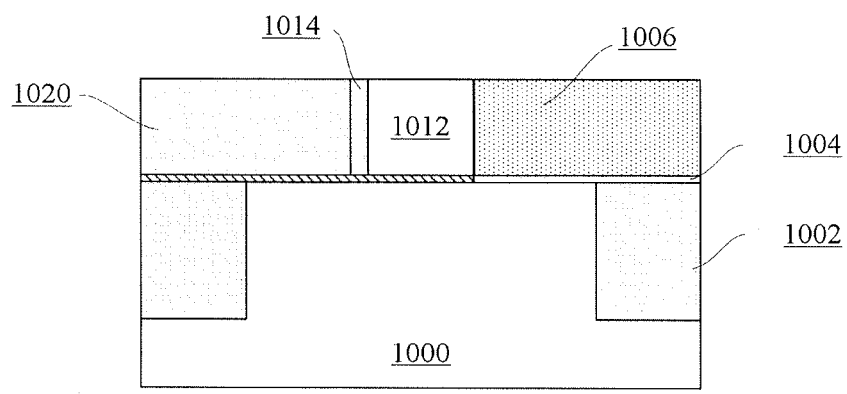

Next, as shown in FIG. 13, a second shielding sub-layer 1020 may be formed on the substrate, to cover at least the above formed one of the source and drain regions. For example, the second shielding sub-layer 120 may comprise oxide (e.g., silicon oxide). Then, a planarization process such as CMP can be performed to expose the first shielding sub-layer 1006 and the first spacer (including the first sub-spacer 1012 and the second sub-spacer 1014) to facilitate following processes (as described above in conjunction with FIG. 5).

Figure 14:
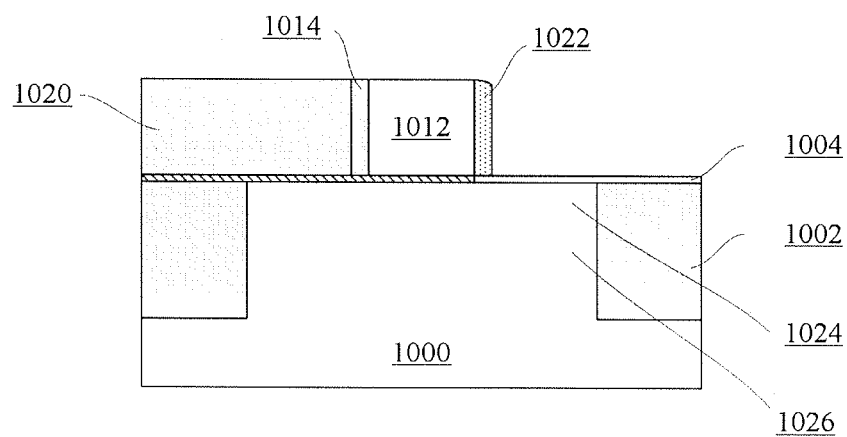

Subsequently, as shown in FIG. 14, the first shielding sub-layer 1006 can be removed by selectively etching (as described above in conjunction with FIG. 6). Then, a second spacer 1022 can be formed on a sidewall of the first sub-spacer 1012. For example, the second spacer 1022 may comprise nitride (e.g., silicon nitride), with a dimension substantially corresponding to a gate spacer (e.g., with a width of about 5-20 nm).

Thus, as shown in FIG. 14, the second shielding sub-layer 120, the first spacer (including the first sub-spacer 1012 and the second sub-spacer 1014), and the second spacer 1022 (which together constitute "a second shielding layer") expose a portion of the active region. Then, the other of the source and drain regions can be formed in the exposed portion of the active region by means of a source/drain formation process. For example, a halo region (not shown), an extension region 1024 and a source/drain implantation region 1026 can be formed according to the process described above in conjunction with FIG. 6. For details of the halo region, the extension region 1024 and the source/drain implantation region 1026, reference may be made to the above descriptions in conjunction with FIG. 6.

Figure 15:
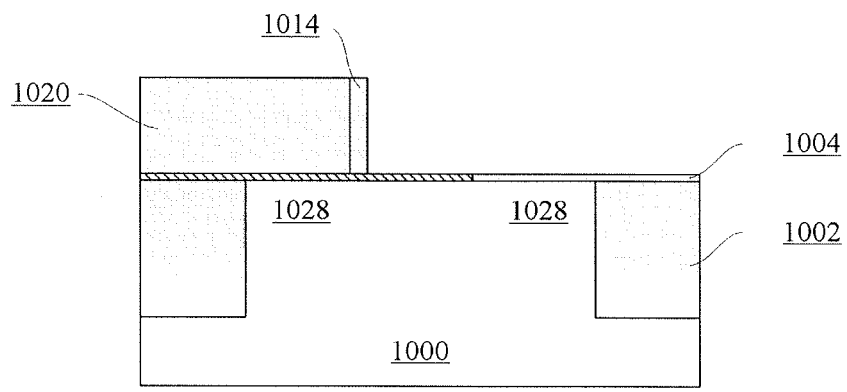

Next, as shown in FIG. 15, annealing, such as spike annealing, laser annealing, and flash annealing, can be performed to activate the implanted impurities, to form final source and drain regions 1028.

Subsequently, the second spacer 1022 and a portion of the first spacer (specifically, the first sub-spacer 1012) can be removed by selective etching to leave the second sub-spacer 1014 remained. For example, the second spacer 1022 (e.g., silicon nitride) may be selectively removed by hot phosphoric acid, and the first sub-spacer 1012 (e.g., polysilicon or amorphous silicon) may be selectively removed by means of a TMAH solution. As a result, a relatively large space (substantially corresponding to the gate region+the other of the source and drain regions) is reserved on the side of the second sub-spacer 1014, so that it is easy to form a gate stack.

Figure 16:
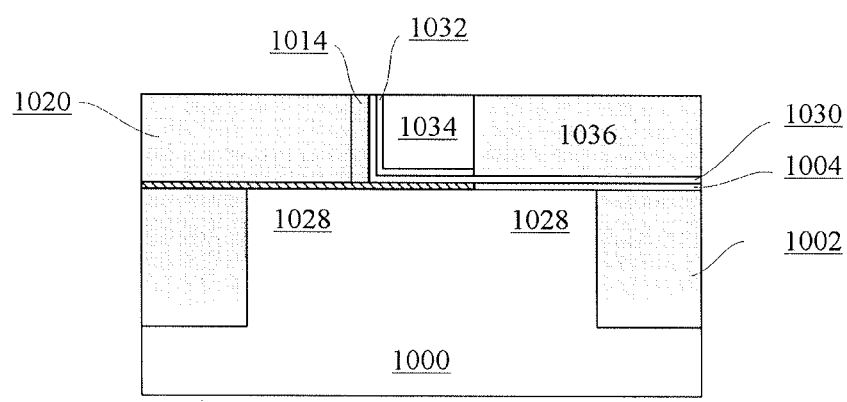

Then, as shown in FIG. 16, the gate stack can be formed. Specifically, a gate dielectric layer 1030, a work function adjustment layer 1032, and a gate conductor 1034 as a spacer can be formed sequentially (as described above in conjunction with FIG. 8). After that, an interlayer dielectric layer 1036 can be formed by means of e.g. deposition, and planarized by means of e.g., CMP. The interlayer dielectric layer 1036 may comprise oxide (e.g., silicon oxide), nitride or any combination thereof (as described above in conjunction with FIG. 9). Further, the interlayer dielectric layer 1036 may be stressed.

Figure 17:
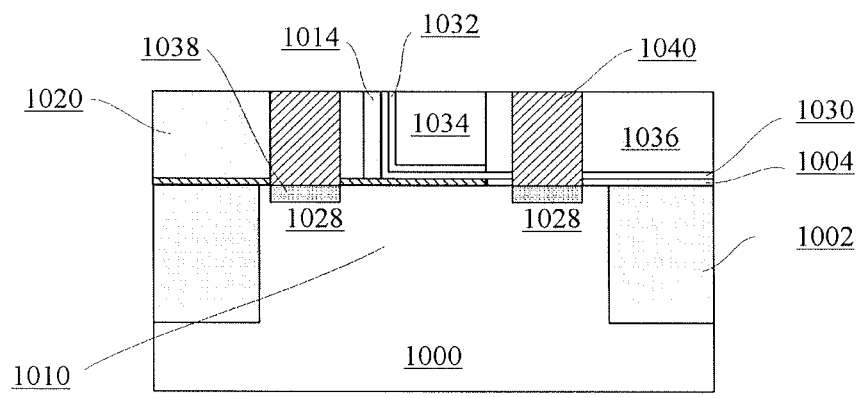

Next, as shown in FIG. 17, contacts 1038 corresponding to the source and drain regions can be formed. For example, the contacts 1038 may comprise metal such as W or Cu. According to an embodiment, to improve the ohmic contact, a metal silicide layer 1036 may be formed in the source and drain regions, so that the contacts 1038 are in electrical contact with the source and drain regions via the metal silicide layer 1036. For example, the metal silicide layer 1036 may comprise NiPtSi. There are various ways to form the metal silicide layer 1036 and the contacts 1038, and detailed descriptions thereof are omitted here.

Thus, an illustrative semiconductor device according to the present disclosure is achieved. As shown in FIG. 17, the semiconductor device may comprise the source and drain regions (1028) and the gate stack (1030, 1032, 1034) formed on the substrate. On one side (the left side in the example shown in FIG. 17) of the gate stack, there is the second sub-spacer 1014. The gate stack, especially, the gate conductor 134, is formed as a spacer on the sidewall of the second sub-spacer (or a gate spacer) 1014. The semiconductor device may comprise the asymmetric SSRW 1010, which extends in the substrate under the gate stack and extends to the source or drain region on the one side of the gate stack.

Next, a flow of manufacturing a semiconductor device according to a further embodiment of the present disclosure is described with reference to FIGS. 18-20. Similar or like reference symbols in FIGS. 18-20 denote similar or like components as those shown in FIGS. 1-10. In the following, descriptions are mainly directed to differences between this embodiment and the above described embodiments.

Figure 18:
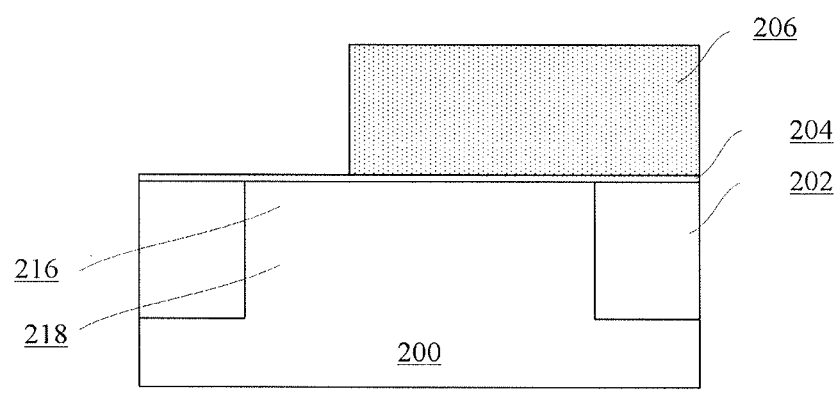
FIGS. 18-20 are schematic views showing a flow of manufacturing a semiconductor device according to a further embodiment of the present disclosure.

As shown in FIG. 18, a substrate 200 is provided. On the substrate 200, STIs 202 can be formed. Optionally, a thin oxide layer 204 is formed on a surface of the substrate 200. For details of the substrate 200 and the oxide layer 204, reference may be made to the above descriptions on the substrate 100 and the oxide layer 104 in conjunction with FIGS. 1-2.

On the substrate 200 (or on the oxide layer 204 in the case where the oxide layer 204 is formed), a first shielding layer 206 with a thickness of e.g. about 100-200 nm can be formed by means of e.g. deposition. For example, the first shielding layer 206 may comprise nitride (e.g. silicon nitride). The first shielding layer 206 can be patterned by means of e.g. RIE to expose a portion of the active region (which portion substantially corresponds to a later formed source or drain region). Then, one of the source and drain regions can be formed in the exposed portion of the active region by means of a source/drain formation process. For example, a halo region (not shown), an extension region 216 and a source/drain implantation region 218 can be formed according to the process described above in conjunction with FIGS. 3 and 4. For details of the halo region, the extension region 216 and the source/drain implantation region 218, reference may be made to the above descriptions in conjunction with FIGS. 3 and 4.

Figure 19:
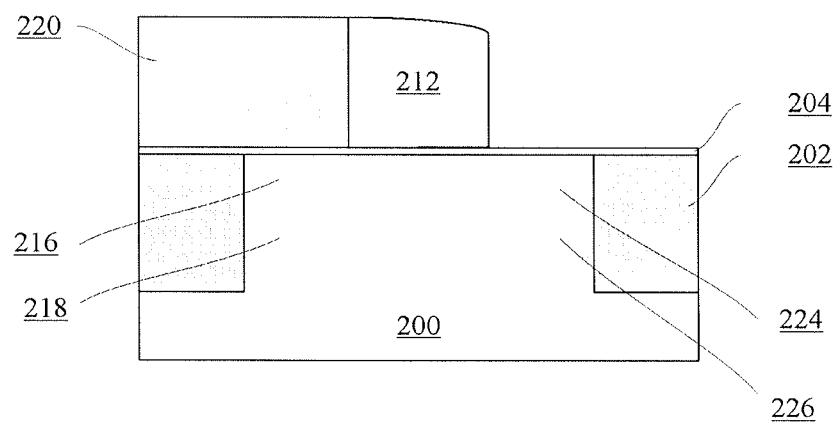

Next, as shown in FIG. 19, a second shielding sub-layer 220 may be formed on the substrate, to cover at least the above formed one of the source and drain regions. For example, the second shielding sub-layer 220 may comprise oxide (e.g., silicon oxide). Then, a planarization process such as CMP can be performed to expose the first shielding layer 206, which then can be removed by selective etching. Then, a first spacer 212 may be formed on a sidewall of the second shielding sub-layer 220. For example, the first spacer 212 may be formed to have a width of about 15-60 nm, to cover a portion of the active region (which portion substantially corresponds to a later formed gate region). The first spacer 212 may comprise polysilicon or amorphous silicon, for example.

Thus, the second shielding sub-layer 220 and the first spacer 212 (which together constitute a "second shielding layer") expose a portion of the active region. Then, the other of the source and drain regions can be formed in the exposed portion of the active region by means of a source/drain formation process. For example, a halo region (not shown), an extension region 224 and a source/drain implantation region 226 can be formed according to the process described above in conjunction with FIG. 6. For details of the halo region, the extension region 224 and the source/drain implantation region 226, reference may be made to the above descriptions in conjunction with FIG. 6.

Figure 20:
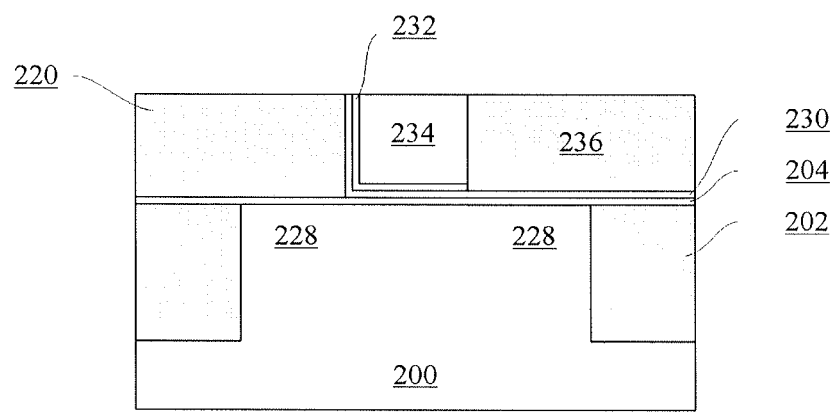

Next, as shown in FIG. 20, annealing, such as spike annealing, laser annealing, and flash annealing, can be performed to activate the implanted impurities, to form final source/drain regions 228.

Subsequently, the first spacer 212 can be removed by selective etching. For example, the first spacer 212 (e.g., polysilicon or amorphous silicon) may be selectively removed by means of a TMAH solution. As a result, a relatively large space (substantially corresponding to the gate region+the other of the source and drain regions) is reserved on the side of the second shielding sub-layer 220, so that it is easy to form a gate stack. For example, a gate dielectric layer 230, a work function adjustment layer 232, and a gate conductor 234 as a spacer can be formed sequentially (as described above in conjunction with FIG. 8). The device shown in FIG. 20 is substantially same in structure as the device shown in FIG. 8. After that, an interlayer dielectric layer 236 can be deposited and planarized, and peripheral components such as contacts can be formed. Detailed descriptions thereof are omitted here. According to an embodiment, the interlayer dielectric layer 236 may be stressed.

Though the above descriptions in conjunction with the embodiment shown in FIGS. 18-20 do not involve an IL, operations for forming the IL can be done as described in the above embodiments.

Figure 21:
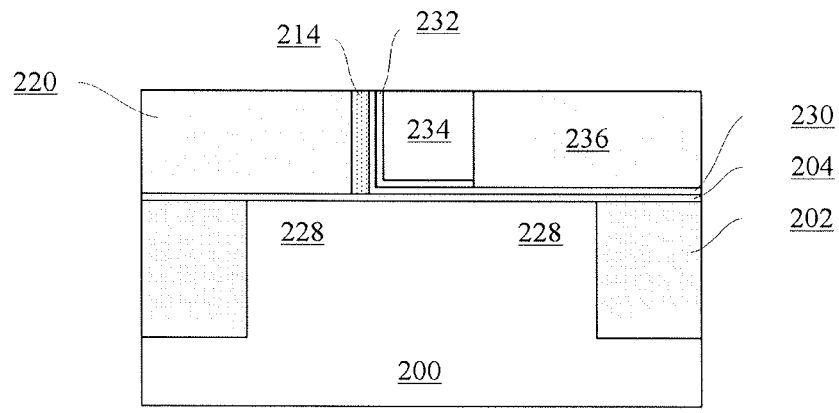
FIG. 21 is a schematic view showing a semiconductor device according to a further embodiment of the present disclosure.

FIG. 21 is a schematic view showing a semiconductor device according to a further embodiment of the present disclosure. The semiconductor device shown in FIG. 21 differs from that shown in FIG. 20 in that: the gate stack, especially, the gate conductor 234, is formed as a spacer on a sidewall of a second spacer 214 on one side (the left side in the example shown in FIG. 21) of the gate stack.

The device shown in FIG. 21 can be manufactured according to the process described above with reference to FIGS. 18-20. For example, the second spacer 214 can be additionally formed on the sidewall of the second shielding sub-layer 220 after the first spacer 212 is removed (referring to the above descriptions in conjunction with FIG. 20). For example, the second spacer 214 may comprise nitride (e.g., silicon nitride), with a thickness of about 5-20 nm. Alternatively, the second spacer 214 may be formed by the first shielding layer 206 which is partially removed in the process of removing the first shielding layer 206 (referring to the above descriptions in conjunction with FIG. 19), or may be formed on a sidewall of the second shielding sub-layer 220 in which case the first spacer 212 is formed on a sidewall of the second spacer 214 (referring to FIG. 19).

Next, a flow of manufacturing a semiconductor device according to a further embodiment of the present disclosure is described with reference to FIGS. 22-26. Similar or like reference symbols in FIGS. 22-26 denote similar or like components as those shown in FIGS. 1-10. In the following, descriptions are mainly directed to differences between this embodiment and the above described embodiments.

Figure 22:
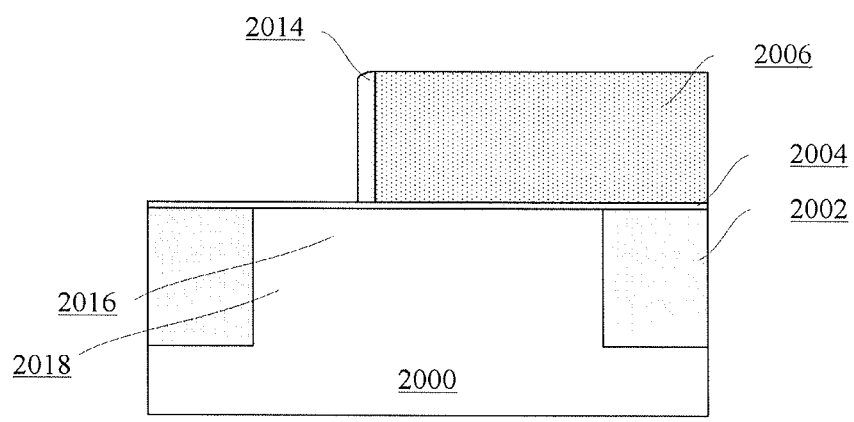
FIGS. 22-26 are schematic views showing, in part, a flow of manufacturing a semiconductor device according to a further embodiment of the present disclosure.

As shown in FIG. 22, a substrate 2000 is provided. On the substrate 2000, STIs 2002 can be formed. Optionally, a thin oxide layer 2004 is formed on a surface of the substrate 2000. For details of the substrate 2000 and the oxide layer 2004, reference may be made to the above descriptions on the substrate 100 and the oxide layer 104 in conjunction with FIGS. 1-2.

On the substrate 2000 (or on the oxide layer 2004 in the case where the oxide layer 2004 is formed), a first shielding sub-layer 2006 with a thickness of e.g. about 100-200 nm can be formed by means of e.g. deposition. For example, the first shielding sub-layer 2006 may comprise nitride (e.g. silicon nitride). On a sidewall of the first shielding sub-layer 2006, a first sub-spacer 2014 can be formed. For example, the first sub-spacer 2014 may comprise oxide (e.g., silicon oxide), with a dimension substantially corresponding to a gate spacer (e.g., with a width of about 5-20 nm). Thus, the first shielding sub-layer 2006 and the first sub-spacer 2014 (which together constitute a "first shielding layer") expose a portion of the active region (which portion substantially corresponds to a later formed source or drain region). Then, one of the source and drain regions can be formed in the exposed portion of the active region by means of a source/drain formation process. For example, a halo region (not shown), an extension region 2016, and a source/drain implantation region 2018 can be formed according to the process described above in conjunction with FIGS. 3 and 4. For details of the halo region, the extension region 2016, and the source/drain implantation region 2018, reference may be made to the above descriptions in conjunction with FIGS. 3 and 4.

Figure 23:
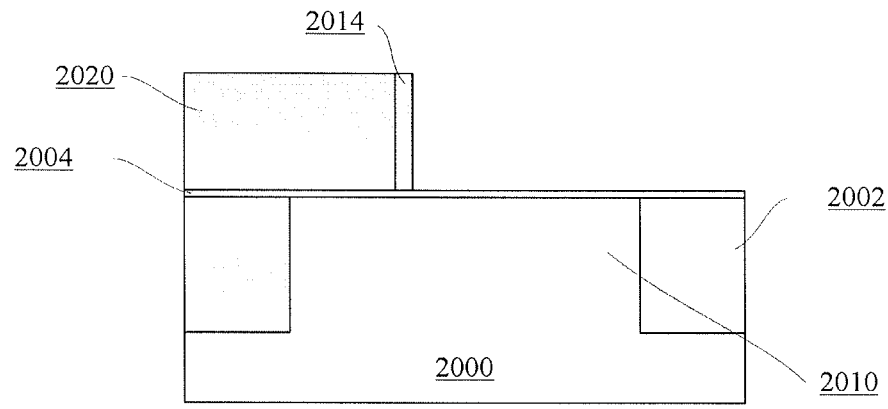

Next, as shown in FIG. 23, a second shielding sub-layer 2020 may be formed on the substrate, to cover at least the above formed one of the source and drain regions. For example, the second shielding sub-layer 2020 may comprise oxide (e.g., silicon oxide). Then, a planarization process such as CMP can be performed to expose the first shielding sub-layer 2006 and the first sub-spacer 2014. The first shielding sub-layer 2006 can be removed by selective etching.

According to an embodiment, for better control of short channel effects and suppression of band-to-band leakage, a SSRW 2010 can be formed by ion implantation with the second shielding sub-layer 2020 and the first sub-spacer 2014 as a mask, as shown in FIG. 23. For details of the SSRW 2010, reference may be made to the above descriptions in conjunction with FIG. 11.

Figure 24:
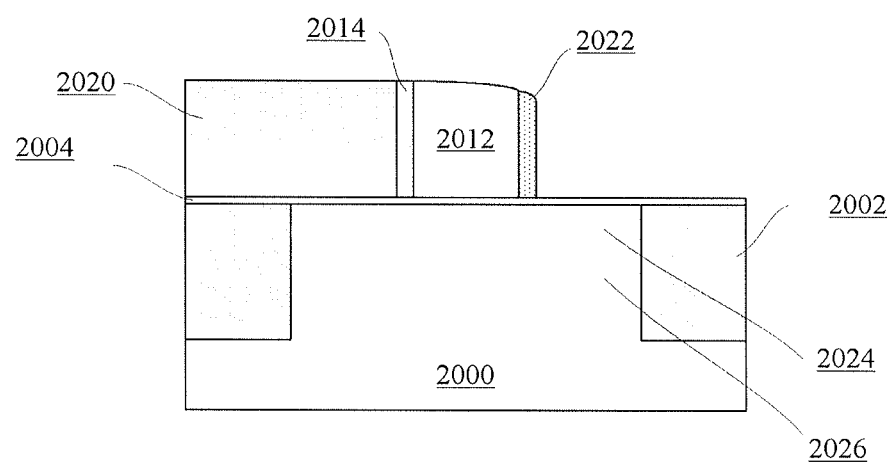

Subsequently, as shown in FIG. 24, a second sub-spacer 2012 may be formed on a sidewall of the first sub-spacer 2014. For example, the second sub-spacer 2012 is formed to have a width of about 5-50 nm to cover a portion of the active region (which portion substantially corresponds to a later formed gate region). The second sub-spacer 1012 may comprise polysilicon or amorphous silicon, for example. On a sidewall of the second sub-spacer 2012, a third sub-spacer 2022 may be formed. For example, the third sub-spacer 2022 may comprise nitride (e.g., silicon nitride), with a dimension substantially corresponding to a gate spacer (e.g., with a width of about 5-20 nm). Thus, the second shielding sub-layer 2020, the first sub-spacer 2014, the second sub-spacer 2012, and the third sub-spacer 2022 (which together constitute a "second shielding layer") expose a portion of the active region. Then, the other of the source and drain regions can be formed in the exposed portion of the active region by means of a source/drain formation process. For example, a halo region (not shown), an extension region 2024 and a source/drain implantation region 2026 can be formed according to the process described above in conjunction with FIG. 6. For details of the halo region, the extension region 2024 and the source/drain implantation region 2026, reference may be made to the above descriptions in conjunction with FIG. 6.

Figure 25:
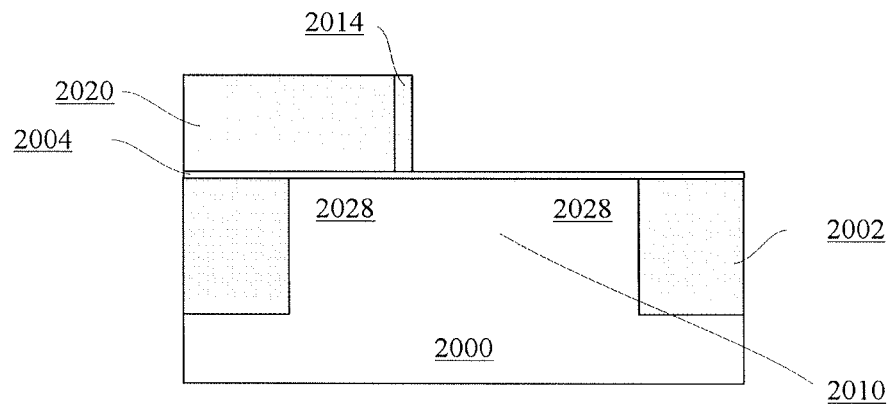
Figure 26:
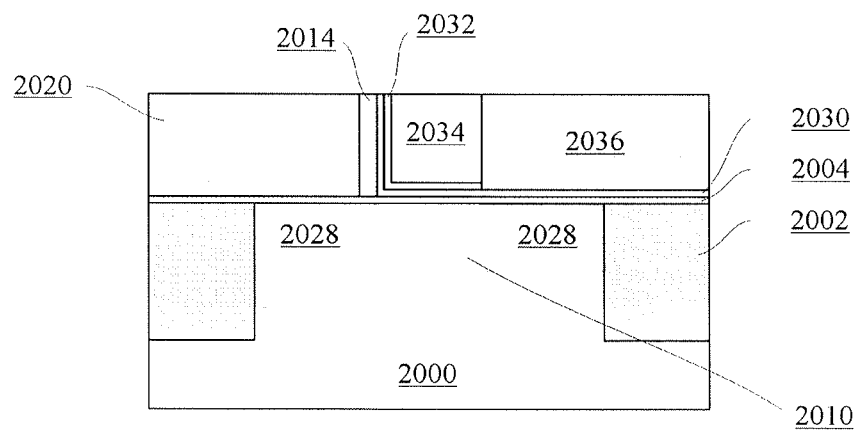

Next, as shown in FIG. 25, annealing, such as spike annealing, laser annealing, and flash annealing, can be performed to activate the implanted impurities, to form final source and drain regions 2028.

Subsequently, the second sub-spacer 2012 and the third sub-spacer 2022 can be removed by selective etching to leave the first sub-spacer 2014 remained. For example, the second sub-spacer 2012 (e.g., polysilicon or amorphous silicon) may be selectively removed by means of a TMAH solution, and the third sub-spacer 2022 (e.g., silicon nitride) may be selectively removed by hot phosphoric acid. As a result, a relatively large space (substantially corresponding to the gate region+the other of the source and drain regions) is reserved on the side of the first sub-spacer 2014, so that it is easy to form a gate stack.

The flow can continue similarly to that shown in FIG. 16, and detailed descriptions thereof are omitted here. For example, the gate stack (including a gate dielectric layer 2030, a work function adjustment layer 2032, and a gate conductor 2034 as a spacer) and an interlayer dielectric layer 2036 can be formed. The interlayer dielectric layer 2036 may be stressed. The resultant device is similar to that shown in FIG. 16, except that the SSRW 2010 extends to the opposite side.

Though the above descriptions in conjunction with the embodiment shown in FIGS. 22-26 do not involve an IL, operations for forming the IL can be done as described in the above embodiments.

In the above descriptions, details of patterning and etching of the layers are not described. It is to be understood by those skilled in the art that various measures may be utilized to form the layers and regions in desired shapes. Further, to achieve the same feature, those skilled in the art can devise processes not entirely the same as those described above. The mere fact that the various embodiments are described separately does not mean that means recited in the respective embodiments cannot be used in combination to advantage.

From the foregoing, it will be appreciated that specific embodiments of the disclosure have been described herein for purposes of illustration, but that various modifications may be made without deviating from the disclosure. In addition, many of the elements of one embodiment may be combined with other embodiments in addition to or in lieu of the elements of the other embodiments. Accordingly, the technology is not limited except as by the appended claims.

We claim:

1. A semiconductor device, comprising:
a substrate; and
source and drain regions and a gate stack formed on the substrate,
wherein the gate stack comprises:
a gate dielectric layer; and
a gate conductor, which is formed as a spacer on a sidewall of a dielectric layer or on a sidewall of a gate spacer on one side of the gate stack, wherein the gate dielectric layer is in an L-shape and extends on a sidewall of the gate conductor on said one side and also on a bottom surface of the gate conductor, and
a stressed interlayer dielectric layer formed on the substrate,
wherein an extent from a sidewall of the gate dielectric layer facing away from the gate conductor to a sidewall of the gate conductor on a further side opposite to said one side is greater than or equal to a distance between the source region and the drain region.

2. The semiconductor device according to claim 1, wherein the gate dielectric layer comprises a high-K dielectric material, and the gate conductor comprises a metal gate conductor material.

3. The semiconductor device according to claim 1, further comprising a work function adjustment layer disposed between the gate dielectric layer and the gate conductor.

4. The semiconductor device according to claim 1, wherein the interlayer dielectric layer is compressive-stressed for a p-type device, or tensile-stressed for an n-type device.

5. The semiconductor device according to claim 1, further comprising a super-steep-retrograded well formed in the substrate, which extends to either the source side or the drain side.

6. The semiconductor device according to claim 1, wherein one of the source and drain regions is positioned on said one side relative to the gate stack, and the other of the source and drain regions is positioned on a further side opposite to said one side relative to the gate stack.

* * * * *